United States Patent
Pushp

(10) Patent No.: US 11,646,143 B2
(45) Date of Patent: May 9, 2023

(54) MAGNETIC MULTI-LAYERS CONTAINING MGO SUBLAYERS AS PERPENDICULARLY MAGNETIZED MAGNETIC ELECTRODES FOR MAGNETIC MEMORY TECHNOLOGY

(71) Applicant: INTERNATIONAL BUSINESS MACHINES CORPORATION, Armonk, NY (US)

(72) Inventor: Aakash Pushp, Santa Clara, CA (US)

(73) Assignee: International Business Machines Corporation, Armonk, NY (US)

( * ) Notice: Subject to any disclaimer, the term of this patent is extended or adjusted under 35 U.S.C. 154(b) by 293 days.

(21) Appl. No.: 16/418,753

(22) Filed: May 21, 2019

(65) Prior Publication Data
US 2020/0373052 A1   Nov. 26, 2020

(51) Int. Cl.
| | | |
|---|---|---|
| H01F 10/32 | (2006.01) | |
| H01L 43/02 | (2006.01) | |
| G11C 11/16 | (2006.01) | |
| H01L 27/22 | (2006.01) | |
| H01F 41/32 | (2006.01) | |
| H01L 43/10 | (2006.01) | |
| H01L 43/12 | (2006.01) | |

(52) U.S. Cl.
CPC ........ H01F 10/3259 (2013.01); G11C 11/161 (2013.01); H01F 10/3286 (2013.01); H01F 41/32 (2013.01); H01L 27/222 (2013.01); H01L 43/02 (2013.01); H01L 43/10 (2013.01); H01L 43/12 (2013.01)

(58) Field of Classification Search
CPC ......... H01L 43/08; H01L 43/02; H01L 43/10; H01L 43/12; H01L 27/222; H01F 10/3259
See application file for complete search history.

(56) References Cited

U.S. PATENT DOCUMENTS

| | | | |
|---|---|---|---|
| 6,347,049 B1 | 2/2002 | Childress et al. | |
| 7,539,047 B2 * | 5/2009 | Katti | G11C 11/5607 365/158 |
| 7,598,555 B1 | 10/2009 | Parkin | |

(Continued)

FOREIGN PATENT DOCUMENTS

WO   WO-2018136003 A1 *   7/2018   ........... G11C 11/161

OTHER PUBLICATIONS

Fahsold et al., "Growth of Fe on MgO (001) studied by He-atom scattering," Physical Review B, vol. 61, No. 12, 2000, pp. 8475-8483.

(Continued)

*Primary Examiner* — Younes Boulghassoul
*Assistant Examiner* — Quinton A Brasfield
(74) *Attorney, Agent, or Firm* — Schmeiser, Olsen & Watts, LLP; James Olsen

(57) ABSTRACT

Various devices are described (along with methods for making them), where the device has a tunnel barrier sandwiched between two magnetic layers (one of the magnetic layers functioning as a free layer and the other of the magnetic layers functioning as a reference layer). One magnetic layer underlies the tunnel barrier and the other magnetic layer overlies the tunnel barrier, thereby permitting spin-polarized current to pass across the magnetic layers and through the tunnel barrier. At least one of the magnetic layers includes a metal oxide sublayer (e.g., an MgO sublayer) sandwiched between magnetic material.

30 Claims, 11 Drawing Sheets

(56) References Cited

U.S. PATENT DOCUMENTS

| | | | |
|---|---|---|---|
| 8,274,818 B2 | 9/2012 | Ohno et al. | |
| 8,319,263 B2* | 11/2012 | Yuasa | H01F 10/3254 257/295 |
| 8,394,649 B2 | 3/2013 | Djayaprawira et al. | |
| 9,087,543 B2 | 7/2015 | Hu et al. | |
| 9,136,464 B1 | 9/2015 | Whig et al. | |
| 9,484,531 B2 | 11/2016 | Hu et al. | |
| 9,825,217 B1 | 11/2017 | Kim et al. | |
| 2003/0053266 A1* | 3/2003 | Dieny | G11B 5/3967 |
| 2006/0042930 A1 | 3/2006 | Mauri | |
| 2010/0178528 A1* | 7/2010 | Tsunekawa | H01F 10/3254 428/811.1 |
| 2014/0084398 A1* | 3/2014 | Oguz | H01L 43/10 257/E29.323 |
| 2014/0284736 A1* | 9/2014 | Toko | H01L 43/12 257/421 |
| 2019/0157544 A1* | 5/2019 | Hsu | H01L 43/02 |
| 2020/0115788 A1* | 4/2020 | Patel | C23C 14/5806 |

OTHER PUBLICATIONS

Wong et al., "Tailoring interlayer exchange coupling of ferromagnetic films across MgO with Fe nanoclusters," Physical Review B, vol. 81, No. 9, 2010, 094406, 8 pp.

Yuasa et al., "Giant room-temperature magnetoresistance in single-crystal Fe/MgO/Fe magnetic tunnel junctions," Nature Materials, vol. 3, No. 12, 2004, pp. 868-871.

Yang et al., "First-principles investigation of the very large perpendicular magnetic anisotropy at Fe/MgO and Co/MgO interfaces," Physical Review B, vol. 84, No. 5, 2011, 054401, 5 pp.

Merriam Webster, retrieved on Apr. 15, 2022 from the Internet: <URL https://www.merriam-webster.com/dictionary/monolayer>, 12 pages.

* cited by examiner

| | | Kv(meV) | | a (Å) | c (Å) | mom (mB) | mom per Fe | Ksh(meV) | Kv+Ksh (meV) | Kv+Ksh (MJ/m^3) | (Kv+Ksh)/mom meV/mB | (Kv+Ksh)/mom mJ/m^2 | Volume (80kbT) @ nm^3 | Diameter of a 2nm thick free layer nm |
|---|---|---|---|---|---|---|---|---|---|---|---|---|---|---|
| Fe/MgO | | | | | | | | | | | | | | |
| test01 | 7Fe/7MgO | -1.61 | a-relax | 2.976 | 25.013 | 18.172 | 2.589 | 0.500 | -1.110 | -0.803 | | -0.06 | 483.41 | 55.11 |
| test02 | 5Fe/1MgO | -2.17 | a-relax | 2.924 | 9.679 | 13.008 | 2.602 | 0.689 | -1.481 | 3.868 | | -0.11 | 135.39 | 29.17 |
| test03 | 6Fe/2MgO | -1.92 | a-relax | 2.940 | 13.178 | 15.734 | 2.622 | 0.732 | -1.188 | 1.671 | | -0.08 | 232.40 | 38.21 |
| test04 | 5Fe/3MgO | -1.71 | a-relax | 2.973 | 13.723 | 13.032 | 2.606 | 0.472 | -1.238 | 1.636 | | -0.10 | 237.37 | 38.62 |
| test05 | 6Fe/4MgO | -1.77 | a-relax | 2.962 | 17.402 | 15.817 | 2.636 | 0.552 | -1.218 | 1.278 | | -0.08 | 303.85 | 43.69 |
| test06 | 5Fe/5MgO | -1.58 | a-relax | 2.984 | 17.949 | 13.050 | 2.610 | 0.359 | -1.221 | 1.224 | | -0.09 | 317.22 | 44.64 |
| test07 | 1Fe/1MgO | -0.82 | a-relax | 2.907 | 4.141 | 2.672 | 2.672 | 0.059 | -0.761 | 3.439 | | -0.28 | 112.88 | 26.63 |
| | | -0.88 | ai(MgO) | 2.970 | 3.967 | 2.585 | | 0.064 | -0.816 | 3.735 | | -0.32 | 103.97 | 25.56 | 80kbT @80C = 2.426eV
| test08 | 2Fe/1MgO | -1.14 | a-relax | 2.979 | 5.311 | 5.368 | 2.684 | 0.206 | -0.934 | 3.175 | | -0.17 | 122.28 | 27.72 |
| | | -1.13 | ai(MgO) | 2.970 | 5.343 | 5.372 | | 0.206 | -0.924 | 3.140 | | -0.17 | 123.65 | 27.87 |
| test09 | 3Fe/1MgO | -1.42 | a-relax | 2.949 | 6.818 | 7.969 | 2.656 | 0.361 | -1.059 | 2.862 | | -0.13 | 135.65 | 29.19 |
| | | -1.61 | ai(MgO) | 2.970 | 6.721 | 7.958 | | 0.360 | -1.250 | 3.378 | | -0.16 | 114.93 | 26.87 |
| test10 | 4Fe/1MgO | -1.91 | a-relax | 2.943 | 8.201 | 10.461 | 2.615 | 0.519 | -1.391 | 3.138 | | -0.13 | 123.75 | 27.88 |
| | | | ai(MgO) | 2.970 | 8.052 | 10.411 | | 0.514 | | | | | | |
| test11 | 1Fe/2MgO | -0.46 | a-relax | 2.954 | 6.116 | 2.167 | 2.167 | 0.030 | -0.430 | 1.292 | | -0.20 | 300.57 | 43.46 |
| | | -0.46 | ai(MgO) | 2.970 | 6.052 | 2.161 | | 0.029 | -0.431 | 1.292 | | -0.20 | 300.44 | 43.45 |
| test12 | 2Fe/2MgO | -1.05 | a-relax | 2.987 | 7.470 | 5.517 | 2.758 | 0.154 | -0.896 | 2.134 | | -0.16 | 180.24 | 33.65 |
| | | -1.04 | ai(MgO) | 2.970 | 7.557 | 5.503 | | 0.153 | -0.887 | 2.132 | | -0.16 | 182.11 | 33.83 |
| test13 | 3Fe/2MgO | -1.51 | a-relax | 2.998 | 8.695 | 7.822 | 2.607 | 0.264 | -1.246 | 2.555 | | -0.16 | 151.94 | 30.90 |
| | | -1.52 | ai(MgO) | 2.970 | 8.858 | 7.833 | | 0.265 | -1.255 | 2.574 | | -0.16 | 150.82 | 30.78 |
| test14 | 4Fe/2MgO | -1.88 | a-relax | 2.964 | 10.309 | 10.645 | 2.661 | 0.422 | -1.458 | 2.580 | | -0.14 | 150.51 | 30.75 |
| | | -1.90 | ai(MgO) | 2.970 | 10.269 | 10.646 | | 0.422 | -1.478 | 2.613 | | -0.14 | 148.48 | 30.54 |

FIG. 5

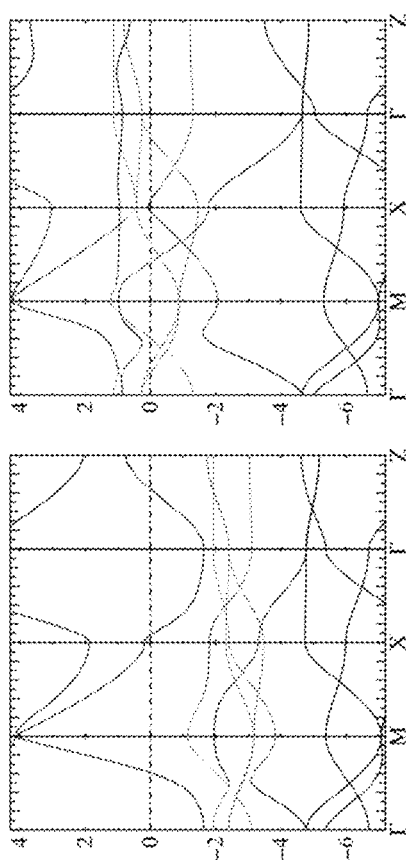
FIG. 6B
FIG. 6A
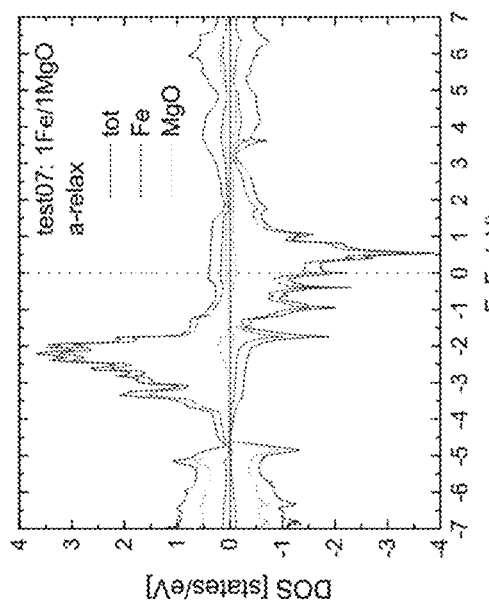
FIG. 6C

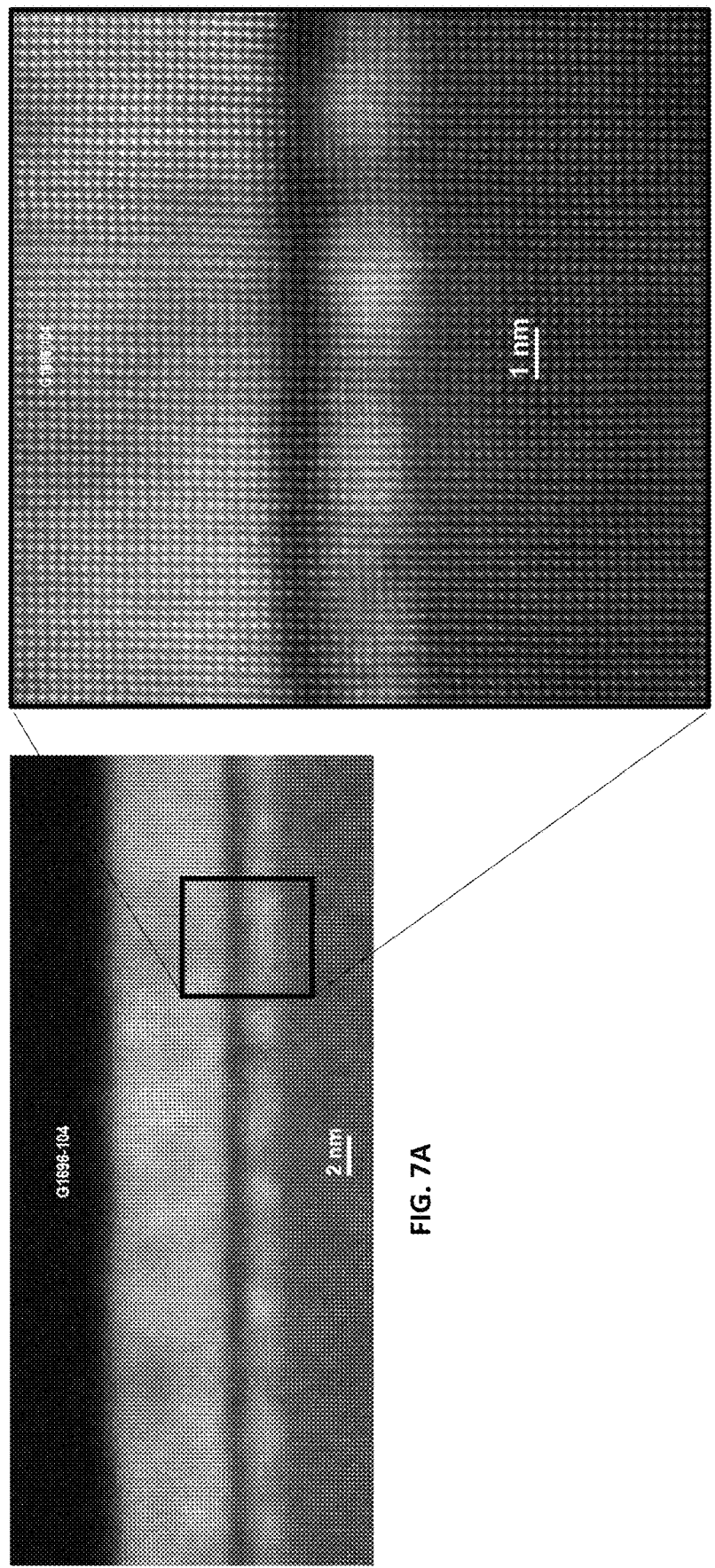

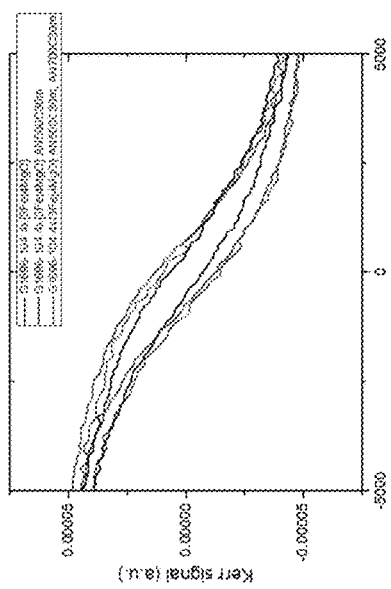
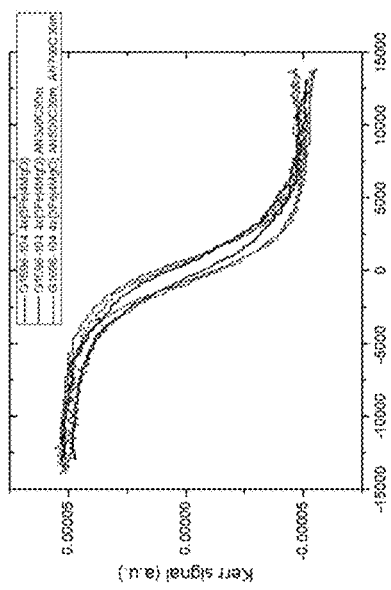
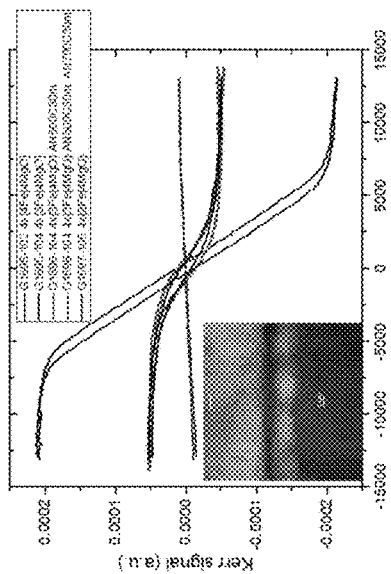
FIG. 8A
FIG. 8B
FIG. 8C

MAGNETIC MULTI-LAYERS CONTAINING MGO SUBLAYERS AS PERPENDICULARLY MAGNETIZED MAGNETIC ELECTRODES FOR MAGNETIC MEMORY TECHNOLOGY

BACKGROUND OF THE INVENTION

Field of Invention

The present invention relates generally to the field of memory technology. More specifically, the present invention is related to nFe|mMgO or nCo|mMgO or nCo$_x$Fe$_y$|mMgO multi-layers that are a few monolayers thin (i.e., n<=10 and m<=5) for perpendicularly magnetized magnetic electrodes, particularly for use in magnetic memory technology.

Discussion of Related Art

For a successful Magnetic Random Access Memory (MRAM) device, a magnetic free layer with high perpendicular magnetic anisotropy (PMA) is desirable in order to scale the device dimensions down to 10 nm and less, so that the magnetic free layer has a high thermal energy barrier between its two possible magnetizations. Not only does this offer higher density, it is also well established that spin transfer torque (STT) is more efficient for switching between the parallel and anti-parallel states as the device is scaled below the dimensions of the magnetic exchange length (~30 nm).

In the conventional CoFeB based PMA materials, it is well established that the interface between CoFeB|MgO, and in particular the Fe—O bond is responsible for high PMA. There are several patents and literature describing this phenomenon.

Embodiments of the present invention are an improvement over such prior art systems and methods.

SUMMARY OF THE INVENTION

In one embodiment, the present invention provides a device comprising: (a) a magnetic reference layer; (b) a tunnel barrier disposed on top of the magnetic reference layer; and (c) a magnetic free layer disposed on top of the tunnel barrier, wherein the magnetic free layer comprises: (c1) a first magnetic sublayer contacting the tunnel barrier, (c2) an MgO sublayer disposed on top of the first magnetic sublayer, and (c3) a second magnetic sublayer disposed on top of the MgO sublayer.

In another embodiment, the present invention provides a device comprising: (a) a magnetic reference layer, wherein the magnetic reference layer comprises: (a1) a first magnetic sublayer, (a2) an MgO sublayer disposed on top of the first magnetic sublayer, and (a3) a second magnetic sublayer disposed on top of the MgO sublayer; (b) a tunnel barrier disposed on top of the second magnetic layer; and (c) a magnetic free layer disposed on top of the tunnel barrier.

In yet another embodiment, the present invention provides a device comprising: (a) a magnetic reference layer, wherein the magnetic reference layer comprises: (a1) a first magnetic sublayer, (a2) a first MgO sublayer disposed on top of the first magnetic sublayer, and (a3) a second magnetic sublayer disposed on top of the first MgO sublayer; (b) a tunnel barrier disposed on top of the second magnetic sublayer; and (c) a magnetic free layer, wherein the magnetic free layer comprises: (c1) a third magnetic sublayer disposed on top of the tunnel barrier, (c2) a second MgO sublayer disposed on top of the third magnetic sublayer, and (c3) a fourth magnetic sublayer disposed on top of the second MgO sublayer.

In another embodiment, the present invention provides a device, comprising: a tunnel barrier sandwiched between two magnetic layers, one of which underlies and one of which overlies the tunnel barrier, thereby permitting spin-polarized current to pass across the magnetic layers and through the tunnel barrier, and where one of the magnetic layers functions as a free layer, and the other of the magnetic layers functions as a reference layer, wherein: at least one of the magnetic layers includes at least an MgO sublayer sandwiched between magnetic material.

In another embodiment, the present invention provides a device, comprising: a tunnel barrier sandwiched between two magnetic layers, one of which underlies and one of which overlies the tunnel barrier, thereby permitting spin-polarized current to pass across the magnetic layers and through the tunnel barrier, and where one of the magnetic layers functions as a free layer, and the other of the magnetic layers functions as a reference layer, wherein: at least one of the magnetic layers includes a metal oxide sublayer sandwiched between magnetic material.

BRIEF DESCRIPTION OF THE DRAWINGS

The present disclosure, in accordance with one or more various examples, is described in detail with reference to the following figures. The drawings are provided for purposes of illustration only and merely depict examples of the disclosure. These drawings are provided to facilitate the reader's understanding of the disclosure and should not be considered limiting of the breadth, scope, or applicability of the disclosure. It should be noted that for clarity and ease of illustration these drawings are not necessarily made to scale.

FIG. 5 illustrates a table showing Density Functional Theory (DFT) calculations of a film stack with multiple layers consisting of a unit cell formed from mFe nMgO.

FIG. 6A shows the majority spin polarized bands of a multi-layer configuration formed from a unit cell consisting of 1Fe/1MgO.

FIG. 6B shows the minority spin polarized bands of a multi-layer configuration formed from a unit cell consisting of 1Fe/1MgO.

FIG. 6C shows the total density of states and contribution from MgO and Fe bands of a multi-layer configuration formed from a unit cell consisting of 1Fe/1MgO.

FIGS. 7A-B illustrates a cross-sectional transmission electron microscope (X-TEM) depicting clustering of Fe in a room temperature grown film stack containing 4 repetitions of a unit cell consisting of 2 monolayers of Fe and 2 monolayers of MgO.

FIG. 8A depicts Polar-Magneto Optical Kerr Effect (p-MOKE) microscopy data of the magnetic moment as a function of magnetic field applied perpendicular to the plane for three different samples G1696-102, G1696-104, and G1697-106 corresponding to 4 repeats of 4 Å Fe/4 Å MgO, 3 Å Fe/4 Å MgO and 2 Å Fe/4 Å MgO.

FIGS. 8B-C are zoom-ins of p-MOKE data of the magnetic moment as a function of the magnetic field applied perpendicular to the plane for sample G1696-104 with 4 repeats of 3 Å Fe/4 Å MgO.

DESCRIPTION OF THE PREFERRED EMBODIMENTS

Figure 1:
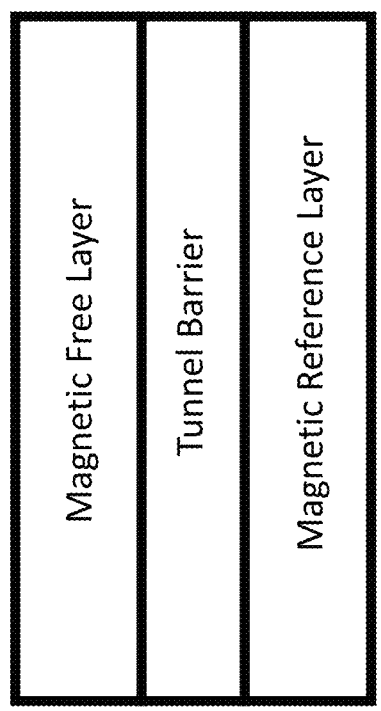
FIG. 1 illustrates a prior art memory device that comprises a magnetic reference layer, a tunnel barrier and a magnetic reference layer.

While this invention is illustrated and described in a preferred embodiment, the invention may be produced in many different configurations. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

Note that in this description, references to "one embodiment" or "an embodiment" mean that the feature being referred to is included in at least one embodiment of the invention. Further, separate references to "one embodiment" in this description do not necessarily refer to the same embodiment; however, neither are such embodiments mutually exclusive, unless so stated and except as will be readily apparent to those of ordinary skill in the art. Thus, the present invention can include any variety of combinations and/or integrations of the embodiments described herein.

FIG. 1 illustrates a prior art memory device that comprises a magnetic reference layer, a tunnel barrier, and a magnetic reference layer.

Figure 2A:
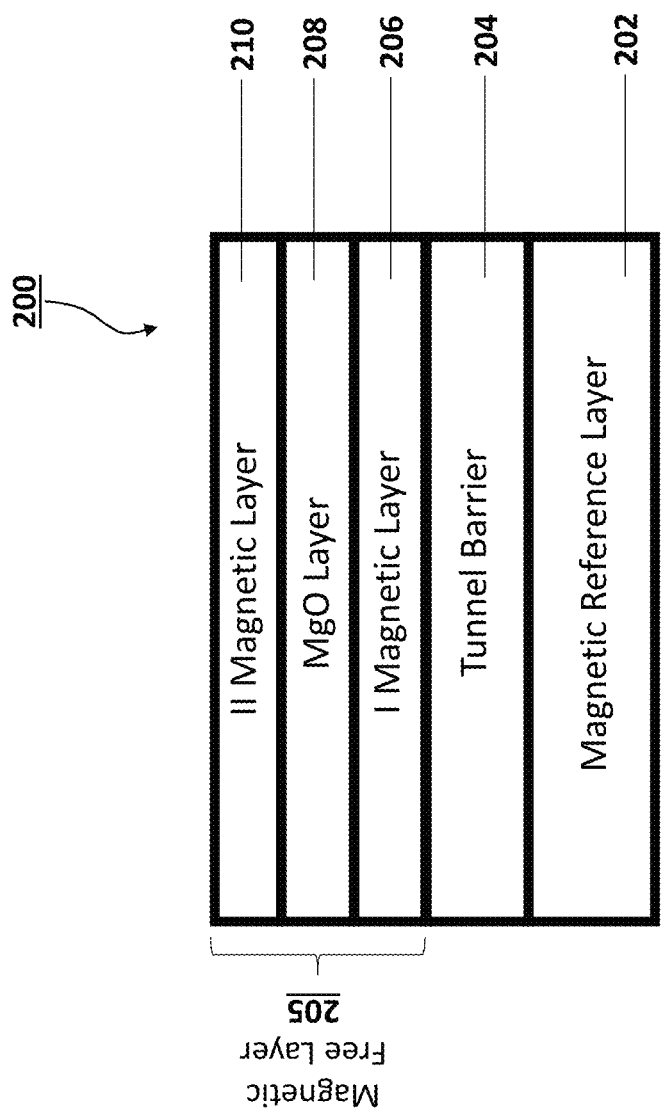
FIG. 2A illustrates one embodiment of the present invention where the magnetic free layer further includes an MgO sublayer.

FIG. 2A illustrates one embodiment of the present invention where the magnetic free layer further includes a metal oxide sublayer (e.g., an MgO sublayer). In this embodiment, the present invention provides a device 200 comprising: (a) a magnetic reference layer 202; (b) a tunnel barrier 204 disposed on top of the magnetic reference layer 202; and (c) a magnetic free layer 205 disposed on top of the tunnel barrier 204, wherein the magnetic free layer 205 comprises: (c1) a first magnetic sublayer 206 contacting the tunnel barrier 204, (c2) an MgO sublayer 208 disposed on top of the first magnetic sublayer 206, and (c3) a second magnetic sublayer 210 disposed on top of the MgO sublayer 208.

Figure 2B:
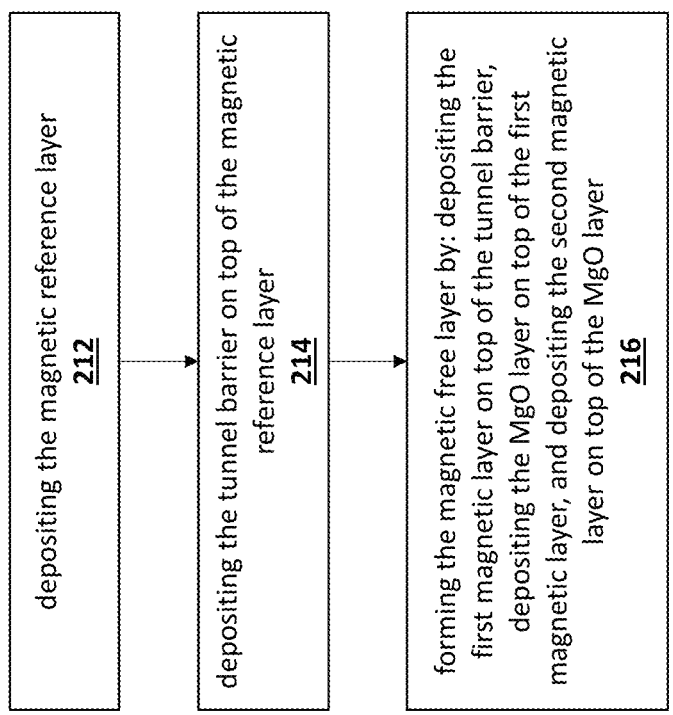
FIG. 2B depicts a flow chart showing the method of forming the device of FIG. 2A.

FIG. 2B depicts a flow chart showing the method of forming the device of FIG. 2A. The method shown in FIG. 2B comprises the steps of: depositing the magnetic reference layer (step 212); depositing the tunnel barrier on top of the magnetic reference layer (step 214); and forming the magnetic free layer by: depositing the first magnetic sublayer on top of the tunnel barrier, depositing the MgO sublayer on top of the first magnetic sublayer, and depositing the second magnetic sublayer on top of the MgO sublayer (step 216).

Figure 3A:
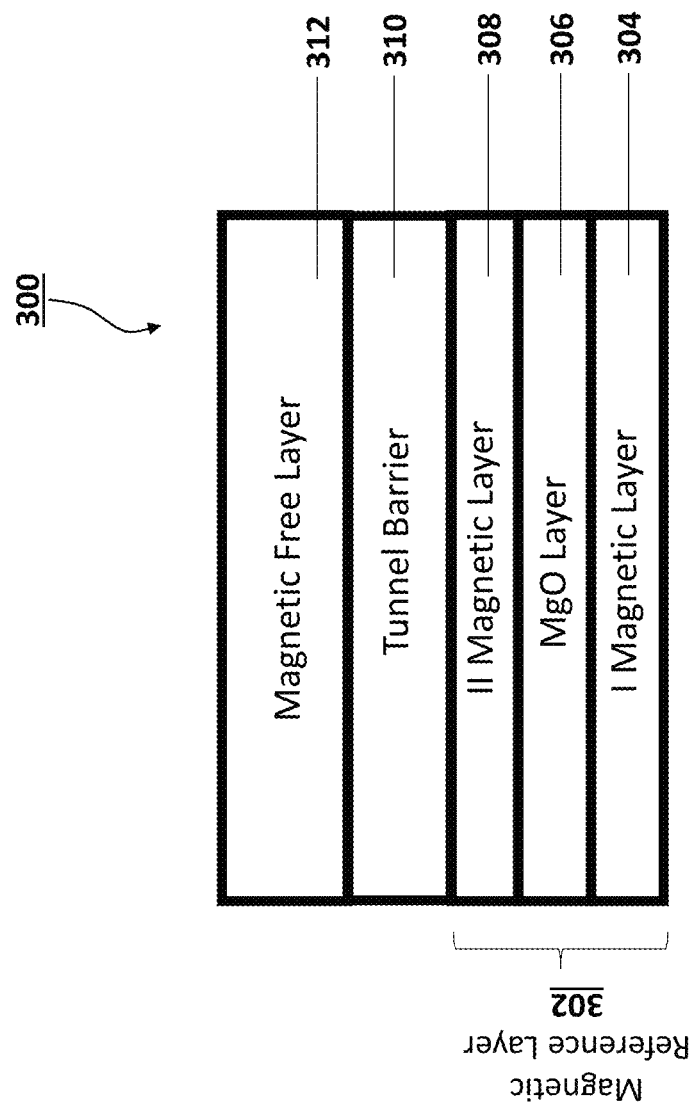
FIG. 3A illustrates another embodiment of the present invention where the magnetic reference layer further includes an MgO sublayer.

FIG. 3A illustrates another embodiment of the present invention where the magnetic reference layer further includes an MgO sublayer. In this embodiment, the present invention provides a device 300 comprising: (a) a magnetic reference layer 302, wherein the magnetic reference layer 302 comprises: (a1) a first magnetic sublayer 304, (a2) an MgO sublayer 306 disposed on top of the first magnetic sublayer 304, and (a3) a second magnetic sublayer 308 disposed on top of the MgO sublayer 306; (b) a tunnel barrier 310 disposed on top of the second magnetic layer 308; and (c) a magnetic free layer 312 disposed on top of the tunnel barrier 310.

Figure 3B:
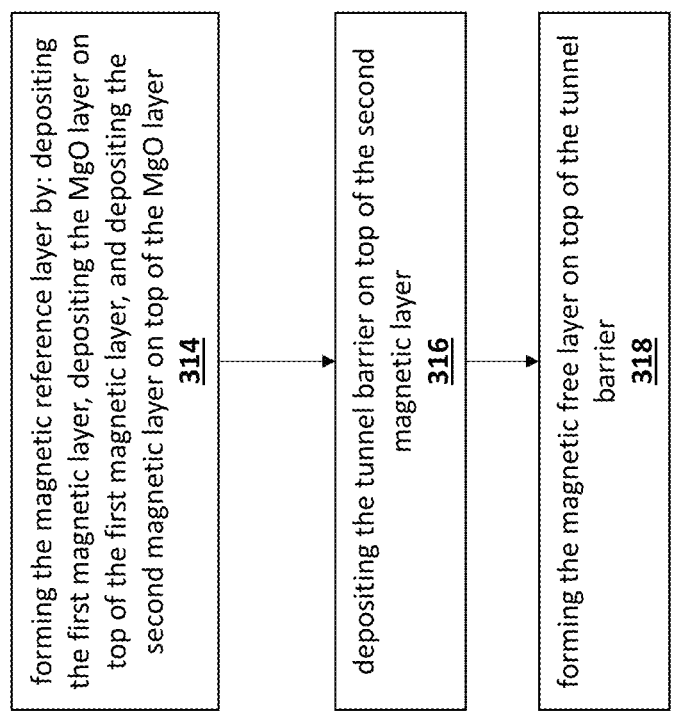
FIG. 3B depicts a flow chart showing the method of forming the device of FIG. 3A.

FIG. 3B depicts a flow chart showing the method of forming the device of FIG. 3A. The method shown in FIG. 3B comprises the steps of: forming the magnetic reference layer by: depositing the first magnetic sublayer, depositing the MgO sublayer on top of the first magnetic sublayer, and depositing the second magnetic sublayer on top of the MgO sublayer (step 314); depositing the tunnel barrier on top of the second magnetic layer (step 316); and forming the magnetic free layer on top of the tunnel barrier (step 318).

Figure 4A:
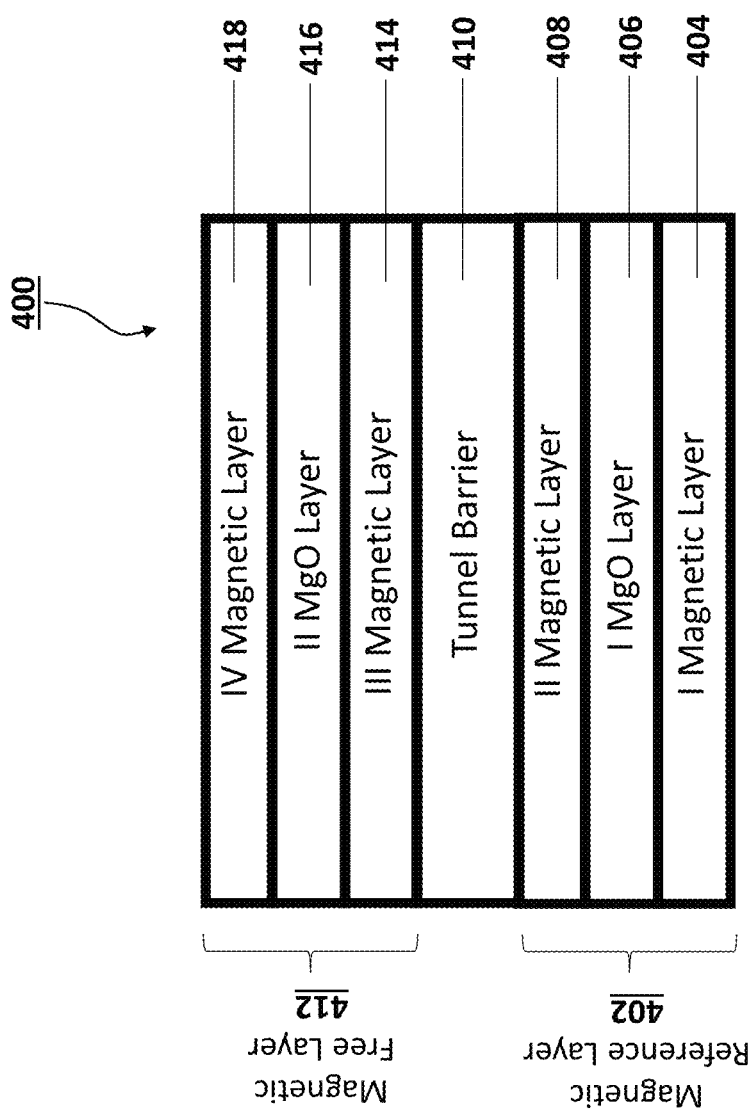
FIG. 4A illustrates yet another embodiment of the present invention where both the magnetic free layer and the magnetic reference layer include an MgO sublayer.

FIG. 4A illustrates yet another embodiment of the present invention where both the magnetic free layer and the magnetic reference layer include an MgO sublayer. In this embodiment, the present invention provides a device 400 comprising: (a) a magnetic reference layer 402, wherein the magnetic reference layer 402 comprises: (a1) a first magnetic sublayer 404, (a2) a first MgO sublayer 406 disposed on top of the first magnetic sublayer 404, and (a3) a second magnetic sublayer 408 disposed on top of the first MgO sublayer 406; (b) a tunnel barrier 410 disposed on top of the second magnetic sublayer 408; and (c) a magnetic free layer 412, wherein the magnetic free layer 412 comprises: (c1) a third magnetic sublayer 414 disposed on top of the tunnel barrier 410, (c2) a second MgO sublayer 416 disposed on top of the third magnetic sublayer 414, and (c3) a fourth magnetic sublayer 418 disposed on top of the second MgO sublayer 416.

Figure 4B:
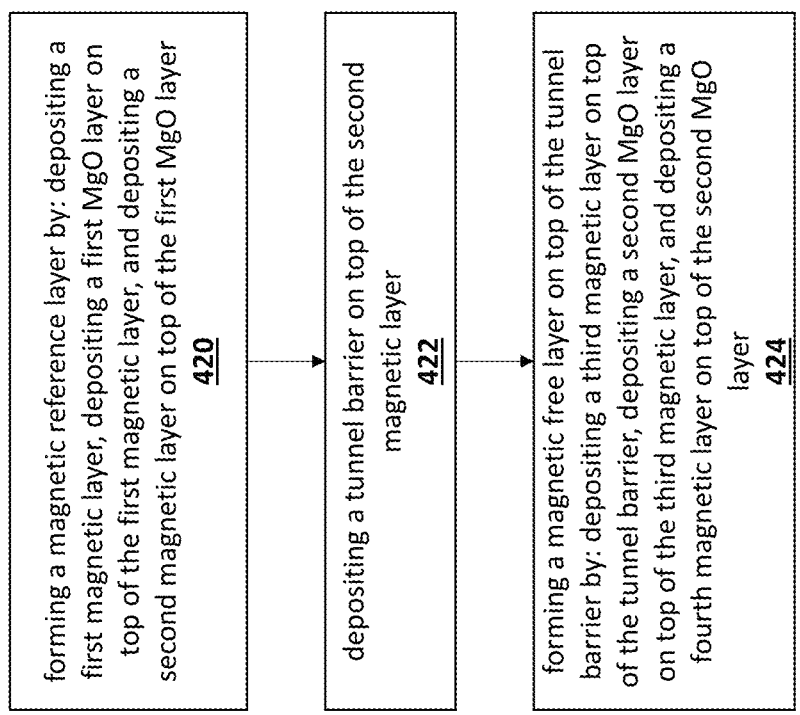
FIG. 4B depicts a flow chart showing the method of forming the device of FIG. 4A.

FIG. 4B depicts a flow chart showing the method of forming the device of FIG. 4A. The method shown in FIG. 4B comprises the steps of: forming a magnetic reference layer by: depositing a first magnetic sublayer, depositing a first MgO sublayer on top of the first magnetic sublayer, and depositing a second magnetic sublayer on top of the first MgO sublayer (step 420); depositing a tunnel barrier on top of the second magnetic sublayer (step 422); and forming a magnetic free layer on top of the tunnel barrier by: depositing a third magnetic sublayer on top of the tunnel barrier, depositing a second MgO sublayer on top of the third magnetic sublayer, and depositing a fourth magnetic sublayer on top of the second MgO sublayer (step 424).

FIG. 5 illustrates a table showing the Density Functional Theory (DFT) calculations of a film stack with multiple layers consisting of unit cell formed from mFe nMgO. Here m and n indicate the number of monolayers of the respective Fe and MgO layers. Several combinations of various thicknesses Fe, MgO have been studied. The shaded column shows negative values which imply perpendicular magnetic anisotropy (PMA) for the structures studied. These values of anisotropy are comparable or even higher than most PMA tetragonally distorted Heusler Alloys. The last column of this table indicates the diameter of a 2 nm thick magnetic free layer formed from such combinations of Fe and MgO multi-layers such that it meets the requirement of 80 $k_BT$ at 80° C.—one of the key requirements for a technology relevant for a magnetic free layer of an MRAM device.

FIG. 6A shows the majority spin polarized bands of a multi-layer configuration formed from a unit cell consisting of 1Fe/1MgO. FIG. 6B shows the minority spin polarized bands of a multi-layer configuration formed from a unit cell consisting of 1Fe/1MgO. FIG. 6C shows the total density of states and contribution from MgO and Fe bands of a multi-layer configuration formed from a unit cell consisting of 1Fe/1MgO. Similar calculations have been performed for all the configurations discussed in the table in FIG. 5, and all of these configurations indicate that bands near the Fermi energy are spin polarized.

In another embodiment, the present invention provides a device, comprising: a tunnel barrier sandwiched between two magnetic layers, one of which underlies and one of which overlies the tunnel barrier, thereby permitting spin-polarized current to pass across the magnetic layers and through the tunnel barrier, and where one of the magnetic layers functions as a free layer, and the other of the magnetic layers functions as a reference layer, wherein: at least one of the magnetic layers includes an MgO sublayer sandwiched between magnetic material.

In yet another embodiment, the present invention provides a device, comprising: a tunnel barrier sandwiched between two magnetic layers, one of which underlies and one of which overlies the tunnel barrier, thereby permitting spin-polarized current to pass across the magnetic layers and through the tunnel barrier, and where one of the magnetic layers functions as a free layer, and the other of the magnetic layers functions as a reference layer, wherein: at least one of the magnetic layers includes a metal oxide sublayer sandwiched between magnetic material.

The present invention discloses forming Fe| MgO| Fe multi-layers as one of the magnetic layers of an MRAM device. Initial Density Functional Theory (DFT) calculations suggest that such a multi-layered, lattice-matched heterostructure not only has very high anisotropy, even higher than most tetragonally distorted Heusler Alloys, but also offers high spin-polarization, thereby offering an extremely promising and simple solution for realizing the magnetic free layer and even part of the reference layer of an MRAM device.

In one embodiment, nFe| mMgO| nFe multi-layers are grown in ultra high vacuum (UHV) environment, where n=1 to 10 monolayers (MLs) of Fe, and m=1 to 5 monolayers of MgO.

In one embodiment, we grow the monolayers of Fe using a collimator so that the deposition rate is significantly reduced, which offers better film thickness control while growing such ultrathin films. In this embodiment, Fe atoms that have smaller lateral momenta are filtered out which enhances the bcc texture desired for Fe|MgO lattice. Small lateral momentum also reduces the propensity of Fe atoms to move around and form 3D island growth.

FIGS. 7A-B illustrate a cross-sectional transmission electron microscope (X-TEM) depicting clustering of Fe grown at room temperature, where 4 repetitions of a unit cell consisting of 2 monolayers of Fe and 2 monolayers of MgO was intended to be grown. Therefore, in one embodiment, the deposition of Fe MLs is done at lower temperatures (approximately 140 K or lower down to 40 K; any range within 40 K-140 K works as per the teachings of the present invention) which will aid in reducing the Fe atoms from hopping and forming a 3D island growth, i.e., clustering.

FIG. 8A depicts Polar-Magneto Optical Kerr Effect (p-MOKE) microscopy data of the magnetic moment as a function of magnetic field applied perpendicular to the plane for three different samples G1696-102, G1696-104, and G1697-106 corresponding to 4 repeats of 4 Å Fe/4 Å MgO, 3 Å Fe/4 Å MgO and 2 Å Fe/4 Å MgO. In particular, the sample G1696-104 with 4 repeats of 3 Å Fe/4 Å MgO has been plotted after ultra high vacuum (UHV) annealing to 500 C and 700 C for 30 mins each. FIGS. 8B-C are zoom-ins of p-MOKE data of the magnetic moment as a function of the magnetic field applied perpendicular to the plane for sample G1696-104 with 4 repeats of 3 Å Fe/4 Å MgO. Data for the same sample have been plotted after ultra high vacuum (UHV) annealing to 500 C and 700 C for 30 mins each. The hysteresis in these plots indicates that some regions might be PMA as shown in the TEM image in the inset of FIG. 8A.

MgO is preferably grown using an RF sputtering method or ebeam evaporation for better thickness control of the MgO film. Fe can be grown using either sputtering, collimated sputtering, evaporation or any other PVD techniques and their combinations.

After the growth is finished, the multi-layer stack maybe annealed for better texture and to improve the interfaces.

In the preferred embodiment, the devices described above are part of a magnetoresistive random-access memory (MRAM).

In the preferred embodiment, the various magnetic layers described above may include one or more of the following materials: Fe, Co, and Ni.

In the preferred embodiment, the MgO sublayer described above includes no more than 4 monolayers and has a thickness of less than or equal to 0.84 nm.

In the preferred embodiment, a thickness of the MgO sublayer is chosen such that exchange coupling between magnetic sublayers within the magnetic free layer is not broken.

It should be noted that while the examples disclosed use a MgO sublayer, other metal oxide sublayers are also envisioned in lieu of the MgO sublayer. Other examples of metal oxide sublayers that may be used include: ZnO, CaO, NiO, FeO, or their combinations.

It should also be noted that while the various layers/sublayers described and depicted in FIGS. 2A-B through 4A-B are done so in a particular order, this should not be used to limit the scope of the present invention. For example, the MRAM may have an inverted structure where the free layer is at the bottom of the stack, the tunnel barrier overlies this free layer, and the reference layer overlies the tunnel barrier. The scope of the present invention is intended to cover such inverted structures.

Additionally, while the various embodiments described herein show the magnetic free layer and/or the magnetic reference layer having a metal oxide sublayer (such as MgO sublayer) sandwiched between two magnetic sublayer, it should be noted that the present invention covers scenarios where each of the free layer and/or the reference layer may comprise multiple layers.

As an non-limiting example, the present invention covers a scenario where the free layer and/or the reference layer comprises multi-layers such as nFe|mMgO|n-'Fe|m'MgO|n"Fe where n or n' or n" is equal to 1 to 10 monolayers (MLs), and where m or m' is equal to 1 to 5 MLs. As another non-limiting example, the present invention covers a scenario where the free layer and/or the reference layer comprises multi-layers such as nFe|mMgO|n'Co|m'MgO|n"Fe where n or n' or n" is equal to 1 to 10 MLs, and where m or m' is equal to 1 to 5 MLs. As yet another example, the present invention also covers a scenario where the free layer and/or the reference layer comprises multi-layers such as nCoxFe1-x|mMgO|n-'Cox'Fe1-x'|m'MgO|n"Cox"Fe1-x" where n or n' or n" is equal to 1 to 10 MLs, where m or m' is equal to 1 to 5 MLs, where x, x' and x" have the range from 0 to 1.

CONCLUSION

An effective implementation has been shown in the above embodiments for multi-layers containing MgO sublayers as perpendicularly magnetized magnetic electrodes, particularly for use in magnetic memory technology. While various preferred embodiments have been shown and described, it will be understood that there is no intent to limit the invention by such disclosure, but rather, it is intended to cover all modifications falling within the spirit and scope of the invention, as defined in the appended claims.

The invention claimed is:

1. A device comprising:
   (a) a magnetic reference layer;
   (b) a tunnel barrier disposed on top of the magnetic reference layer; and
   (c) a magnetic free layer disposed on top of the tunnel barrier,
   wherein the magnetic free layer comprises: (c1) a first magnetic sublayer contacting the tunnel barrier, (c2) an MgO sublayer disposed on top of the first magnetic sublayer, and (c3) a second magnetic sublayer disposed on top of the MgO sublayer,
   wherein the MgO sublayer consists of m monolayers of MgO where m is in a range of 2 to 5,
   wherein a Fe layer selected from the group consisting of the magnetic reference layer, the first magnetic sublayer, and the second magnetic sublayer consists of n monolayers of Fe where n is in a range of 2 to 6.

2. The device of claim 1, wherein the magnetic reference layer comprises: (a1) a third magnetic sublayer, (a2) another MgO sublayer disposed on top of the third magnetic sublayer, and (a3) a fourth magnetic sublayer disposed on top of the another MgO sublayer and contacting the tunnel barrier.

3. The device of claim 1, wherein the device is part of a magnetoresistive random-access memory (MRAM).

4. The device of claim 1, wherein at least one magnetic sublayer of the first and second magnetic sublayers include Fe.

5. The device of claim 1, wherein at least one magnetic sublayer of the first and second magnetic sublayers include one or more of the following: Fe, Co, and Ni.

6. The device of claim 1, wherein the MgO sublayer includes no more than 4 monolayers and has a thickness of less than or equal to 0.84 nm.

7. The device of claim 1, wherein a thickness of the MgO sublayer constrains exchange coupling between magnetic sublayers within the magnetic free layer to not be broken.

8. The method of claim 1, wherein the Fe layer is the magnetic reference layer.

9. The method of claim 1, wherein the Fe layer is the first magnetic sublayer.

10. The method of claim 1, wherein the Fe layer is the second magnetic sublayer.

11. A device comprising:
    (a) a magnetic reference layer, wherein the magnetic reference layer comprises: (a1) a first magnetic sublayer, (a2) a first MgO sublayer disposed on top of the first magnetic sublayer, and (a3) a second magnetic sublayer disposed on top of the first MgO sublayer;
    (b) a tunnel barrier disposed on top of, and in direct contact with, the second magnetic sublayer; and
    (c) a magnetic free layer, wherein the magnetic free layer comprises: (c1) a third magnetic sublayer disposed on top of, and in direct contact with, the tunnel barrier, (c2) a second MgO sublayer disposed on top of the third magnetic sublayer, and (c3) a fourth magnetic sublayer disposed on top of the second MgO sublayer,
    wherein one MgO sublayer selected from the group consisting of the first MgO sublayer and the second MgO sublayer consists of m monolayers of MgO where m is in a range of 2 to 5,
    wherein a Fe layer selected from the group consisting of the first magnetic sublayer, the second magnetic sublayer, the third magnetic sublayer, and the fourth magnetic sublayer consists of n monolayers of Fe where n is in a range of 2 to 6.

12. The method of claim 11, wherein the Fe layer is the first magnetic sublayer.

13. The method of claim 11, wherein the Fe layer is the second magnetic sublayer.

14. The method of claim 11, wherein the Fe layer is the third magnetic sublayer.

15. The method of claim 11, wherein the Fe layer is the fourth magnetic sublayer.

16. The method of claim 11, wherein the one MgO sublayer is the first MgO sublayer.

17. The method of claim 11, wherein the one MgO sublayer is the second MgO sublayer.

18. A device, comprising:
    a tunnel barrier sandwiched between two magnetic layers, one of which underlies and one of which overlies the tunnel barrier, thereby permitting spin-polarized current to pass across the magnetic layers and through the tunnel barrier, one of the magnetic layers functions as a free layer, and the other of the magnetic layers functions as a reference layer, wherein:
    at least one magnetic layer of the two magnetic layers includes an MgO sublayer sandwiched between magnetic material,
    wherein the MgO sublayer consists of m monolayers of MgO where m is in a range of 2 to 5,
    wherein a Fe layer selected from the group consisting of the magnetic layer functioning as the free layer and the magnetic layer functioning as the reference layer consists of n monolayers of Fe where n is in a range of 1 to 6.

19. The device of claim 18, wherein n is in a range of 2 to 6.

20. The device of claim 18, wherein each magnetic layer of the two magnetic layers include at least an MgO sublayer sandwiched between magnetic material.

21. The device of claim 18, wherein the magnetic layers include Fe.

22. The device of claim 18, wherein each magnetic layer of the two magnetic layers includes one of more of the following: Fe, Co, and Ni.

23. The device of claim 18, wherein the MgO layer includes no more than 4 monolayers and has a thickness of less than or equal to 0.84 nm.

24. The device of claim 18, wherein the MgO layer is thin enough that exchange coupling between magnetic sublayers within said at least one magnetic layer of the two magnetic layers is not broken.

25. The method of claim 18, wherein the Fe layer is the magnetic layer functioning as the free layer.

26. The method of claim 18, wherein the Fe layer is the magnetic layer functioning as the reference layer.

27. A device, comprising:
    a tunnel barrier sandwiched between two magnetic layers, one of which underlies and one of which overlies the tunnel barrier, thereby permitting spin-polarized current to pass across the magnetic layers and through the tunnel barrier, one of the magnetic layers functions as a free layer, and the other of the magnetic layers functions as a reference layer, wherein at least one of the magnetic layers includes a metal oxide sublayer sandwiched between magnetic material, wherein a Fe layer selected from the group consisting of the magnetic layer functioning as the free layer and the magnetic layer functioning as the reference layer consists of n monolayers of Fe where n is in a range of 2 to 6.

28. The device of claim 27, wherein each magnetic layer of the two magnetic layers was deposited on the tunnel barrier at a temperature within a range of 40 deg K to 140 deg K.

29. The method of claim 27, wherein the Fe layer is the magnetic layer functioning as the free layer.

30. The method of claim 27, wherein the Fe layer is the magnetic layer functioning as the reference layer.

* * * * *